US007021520B2

(12) United States Patent (10) Patent No.: US 7,021,520 B2
Bowen (45) Date of Patent: Apr. 4, 2006

(54) STACKED CHIP CONNECTION USING STAND OFF STITCH BONDING

(75) Inventor: Neal M. Bowen, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 396 days.

(21) Appl. No.: 10/002,175

(22) Filed: Dec. 5, 2001

(65) Prior Publication Data

US 2003/0102358 A1 Jun. 5, 2003

(51) Int. Cl.
B23K 31/00 (2006.01)
B23K 31/02 (2006.01)
(52) U.S. Cl. ............... 228/180.5; 228/4.5; 257/777
(58) Field of Classification Search ............. 228/180.5, 228/4.5; 219/56.21, 56.22; 29/740, 840; 257/777; 438/106, 108, 109
See application file for complete search history.

(56) References Cited

U.S. PATENT DOCUMENTS

| | | | | |
|---|---|---|---|---|
| 4,327,860 A | * | 5/1982 | Kirshenboin et al. | 228/180.5 |
| 4,445,633 A | * | 5/1984 | Bonham, Jr. | 228/102 |
| 5,054,194 A | * | 10/1991 | Pollock | 29/840 |
| 5,060,843 A | * | 10/1991 | Yasuzato et al. | 228/179.1 |
| 5,292,050 A | * | 3/1994 | Nagaoka et al. | 228/4.5 |
| 5,498,767 A | * | 3/1996 | Huddleston et al. | 716/12 |
| 5,502,289 A | * | 3/1996 | Takiar et al. | 174/266 |
| 5,702,049 A | * | 12/1997 | Biggs et al. | 228/105 |
| 5,954,260 A | | 9/1999 | Orcutt | |
| 6,059,168 A | | 5/2000 | Shin et al. | |
| 6,065,667 A | | 5/2000 | Singh | |
| 6,079,610 A | | 6/2000 | Maeda et al. | |
| 6,091,140 A | * | 7/2000 | Toh et al. | 257/691 |
| 6,131,792 A | * | 10/2000 | Hortaleza et al. | 228/4.5 |
| 6,148,505 A | * | 11/2000 | Fujishima | 29/740 |
| 6,189,765 B1 | * | 2/2001 | Moon | 228/102 |
| 6,256,875 B1 | | 7/2001 | Watanabe et al. | |
| 6,273,321 B1 | * | 8/2001 | Koduri | 228/4.5 |
| 6,333,562 B1 | * | 12/2001 | Lin | 257/777 |
| 6,457,235 B1 | * | 10/2002 | Chuo et al. | 29/843 |
| 6,476,506 B1 | * | 11/2002 | O'Connor et al. | 257/786 |
| 6,555,917 B1 | * | 4/2003 | Heo | 257/777 |
| 6,561,411 B1 | * | 5/2003 | Lee | 228/180.5 |
| 2002/0030263 A1 | * | 3/2002 | Akram | 257/686 |
| 2002/0064905 A1 | * | 5/2002 | Park et al. | 438/109 |
| 2003/0042621 A1 | * | 3/2003 | Chen et al. | 257/784 |
| 2003/0049882 A1 | * | 3/2003 | Yin et al. | 438/106 |
| 2003/0137042 A1 | * | 7/2003 | Mess et al. | 257/686 |
| 2003/0205725 A1 | * | 11/2003 | Masumoto et al. | 257/200 |

FOREIGN PATENT DOCUMENTS

JP 07-202069 A * 8/1995

* cited by examiner

*Primary Examiner*—Lynne R. Edmondson
(74) *Attorney, Agent, or Firm*—Dickstein Shapiro Morin & Oshinsky LLP

(57) ABSTRACT

The present invention provides a structure, apparatus, and method for wire bonding in which a first wire bond is formed between first and second components, a second wire bond is formed between the second component and a third component such that the second wire bond is in electrical communication with the first wire bond, wherein the first and second wire bonds are connected to said first and second components, respectively, using ball bonding.

40 Claims, 7 Drawing Sheets

STACKED CHIP CONNECTION USING STAND OFF STITCH BONDING

FIELD OF THE INVENTION

The present invention relates generally to wire bonding, and more particularly, to a method and apparatus for wire bonding multiple semiconductor integrated circuit chips.

BACKGROUND OF THE INVENTION

The continuing trend in the semiconductor and integrated circuit industries is to develop and manufacture smaller components. This trend has resulted in integrated circuits and semiconductor devices having higher density due to an increased number of components coexisting in smaller physical areas. This downsizing has directly affected the location, number, and size of bond pads for electrical connections for these devices.

Wire bonding techniques have been developed to accommodate smaller bond pad sizes as well as the stacking of multiple chips in an integrated circuit package. However, decreased size and fewer locations of bond pads on various layers of multiple chips presents a different bonding problem. There exists a need, therefore, for a reliable wire bonding method which provides wire bonds among chips on different layers of a stacked chip assembly, as well as for the resulting wire-bonded assembly.

BRIEF SUMMARY OF THE INVENTION

The present invention provides, in one embodiment, a wire bonded structure having a substrate, a lower chip and an upper chip, a first wire bond formed from the substrate to the lower chip, a second wire bond formed from the lower chip to the upper chip and electrically connected to the first wire bond, wherein the first and said second wire bonds are configured such that an imaginary line drawn between the endpoints of the first wire bond and an imaginary line drawn between the endpoints of the second wire bond form an angle therebetween.

In another aspect the present invention provides a wire bonding apparatus for forming a first conductive bump on a first conductive surface, a first ball bond on a second conductive surface, a first wire bond from the first ball bond to the first conductive bump, a second conductive bump on a third surface, a second ball bond on the second conductive surface in electrical communication with the first conductive bump, and a second wire bond from the second ball bond to the second conductive bump.

The present invention also provides a method for forming such a structure by forming a first wire bond between first and second components, forming a second wire bond between the second component and a third component such that the second wire bond is in electrical communication with the first wire bond, and connecting the first and second wire bonds to the first and second components using ball bonding.

Additional features and advantages of the present invention will be more clearly apparent from the detailed description which is provided in connection with accompanying drawings which illustrate exemplary embodiments of the invention.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and procedural changes may be made without departing from the spirit or scope of the present invention.

Figure 1:
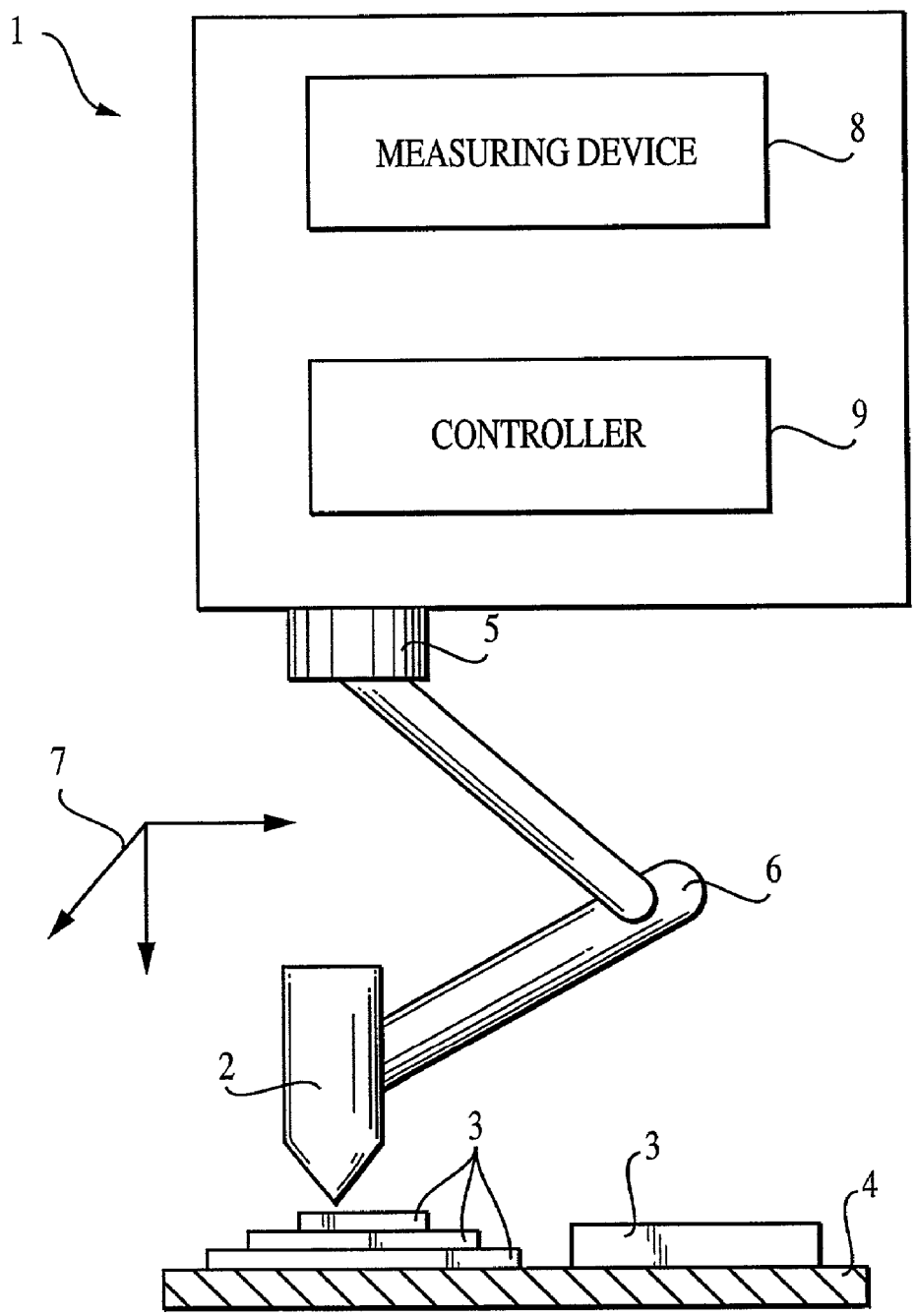
FIG. 1 is a schematic view of a typical wire bonding apparatus.

Before discussing the invention in detail some conventional wire bonding techniques will be discussed with reference to FIGS. 1–4B. Referring now to the drawings, where like elements are designated by like reference numerals, FIG. 1 depicts a wire bonding apparatus generally designated by numeral 1. The wire bonding apparatus may have a wire bonding device 2, such as a capillary, which is controllably positioned relative to workpieces 3 on top of a support surface 4. The bonding device 2 is capable of forming wire bonds at a plurality of bonding positions on workpieces 3.

The wire bonding apparatus 1 further comprises a drive unit 5, such as a motor, for selectively moving control arm 6 which in turn moves the bonding device 2 in any direction represented by multiple arrows 7. The wire bonding apparatus may also comprise a measuring device 8 for measuring movements of the wire bonding device 2, and a controller 9 for controlling the drive unit 5. The foregoing description of a typical wire bonding apparatus is illustrative only and in no way meant to be restrictive in order to practice the present invention.

Figure 2A:
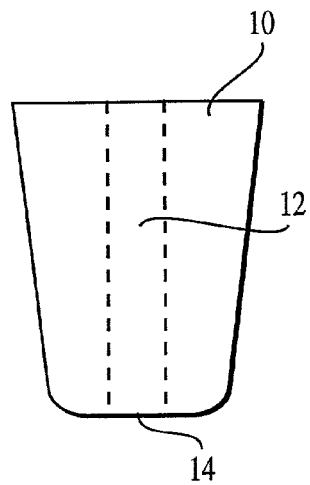
FIG. 2A is a side view of a capillary for forming wire bonds which is used in the present invention.

FIG. 2A depicts a capillary 10 which can be used for wire bonding device 2 of the wire bonding apparatus shown in FIG. 1. The capillary 10 has an internal channel 12 to accommodate flow of material, and an opening 14 to introduce the material to an intended surface.

Figure 2B:
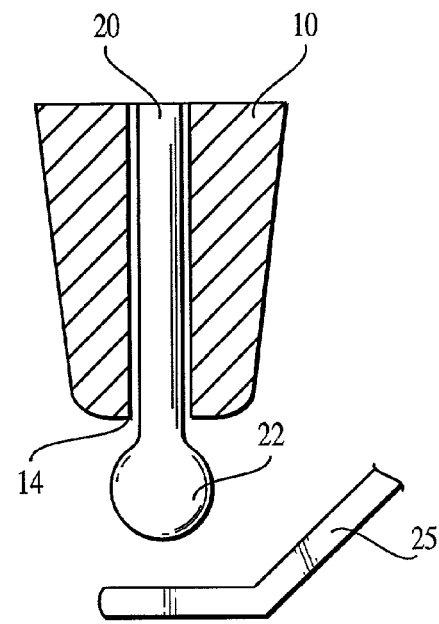
FIGS. 2B–2D illustrate steps in forming a wire bond using the FIG. 2A capillary.
Figure 2C:
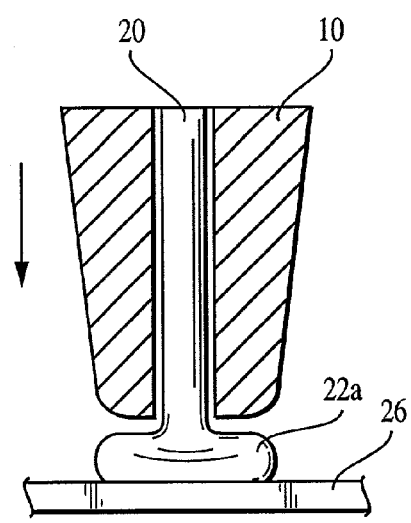
Figure 2D:
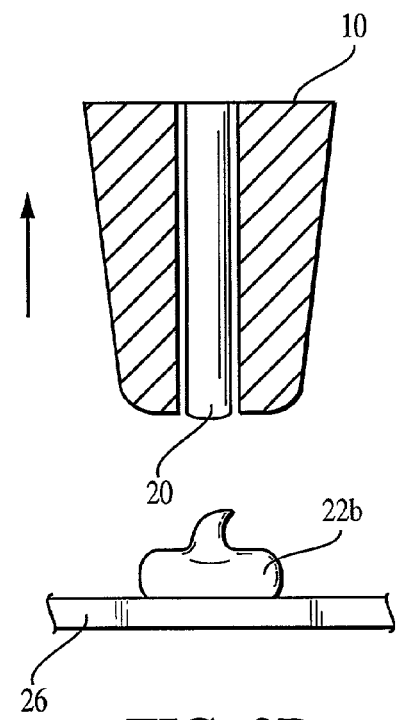

The capillary 10 can be used to form a conductive bump on a surface as depicted in FIGS. 2B–2D. In use, a conductive wire 20 is fed through the channel 12 and out of the opening 14. The wire 20 is preferably a gold wire, however, any suitable conductive material can be substituted. A ball 22 is formed at the tip of the wire 20 by energy generated from an electric discharge of a torch electrode 25, or by heating the tip of the capillary 10. Other methods of forming the ball 22 can also be utilized. The size of the ball 22 can be controlled by varying hardware and software of the wire bonding apparatus.

After the ball 22 is formed, the capillary 10 is positioned above a desired location on a bonding surface 26. The ball 22 is then forced downward to the surface 26 by downward movement of the capillary 10, thereby causing ball 22 to deform into a mass 22a. The downward force of the capillary 10 can be combined with ultrasonic energy to create a bond between the ball 22 and the bonding surface 26. Thereafter, as shown in FIG. 2D, the capillary 10 can be moved away from the surface 26 to leave behind a conductive bump 22b by cutting wire 20. This technique is generally referred to as ball bonding. Alternatively, with wire 20 still attached to the conductive bump 22b, the capillary 10 can be moved to a second position on the bonding surface 26 (or another bonding surface) to form a wire bond connection between the second bonding position and bump 22b.

Figure 3A:
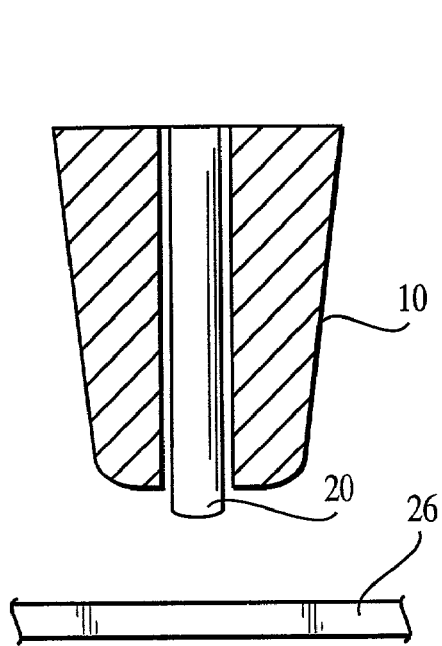
FIGS. 3A–3B illustrate steps in forming another type of wire bond using the FIG. 2A capillary.
Figure 3B:
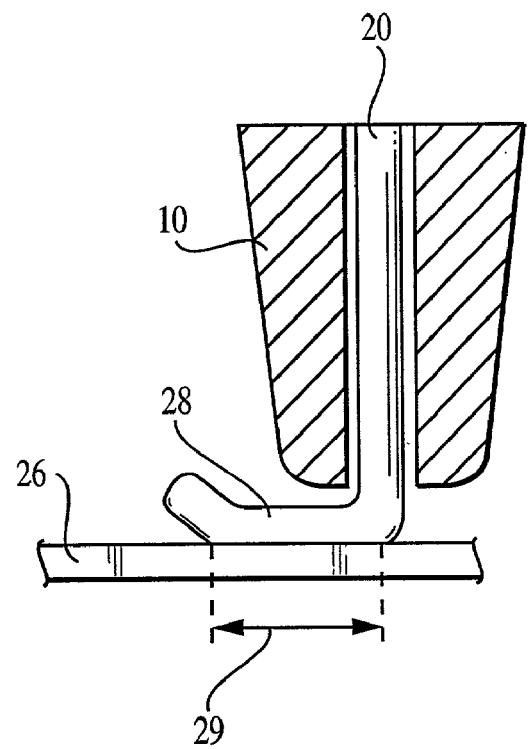

Another bonding technique which can be performed by the capillary 10 is called wedge or stitch bonding, and is illustrated in FIGS. 3A and 3B. The capillary 10 is heated and lowered onto the bonding surface 26 to a distance approximately equal to the thickness of the wire 20. The capillary 10 is then moved relative to the bonding surface 26 as the wire 20 is fed to leave behind a molten linear wire bond section 28 having a bond length 29. The capillary 10 can be used for both ball bonding and stitch bonding.

Figure 4A:
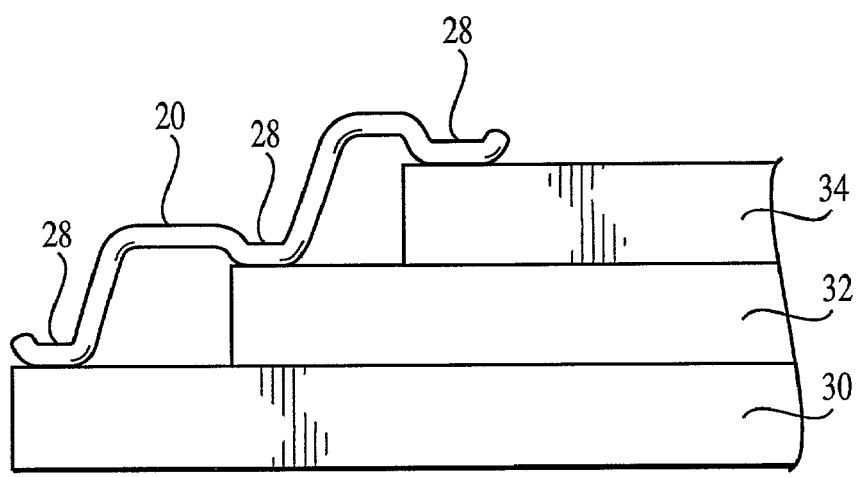
FIGS. 4A–4B illustrate a prior art method of forming a wire bond among multiple chips of a semiconductor assembly.
Figure 4B:
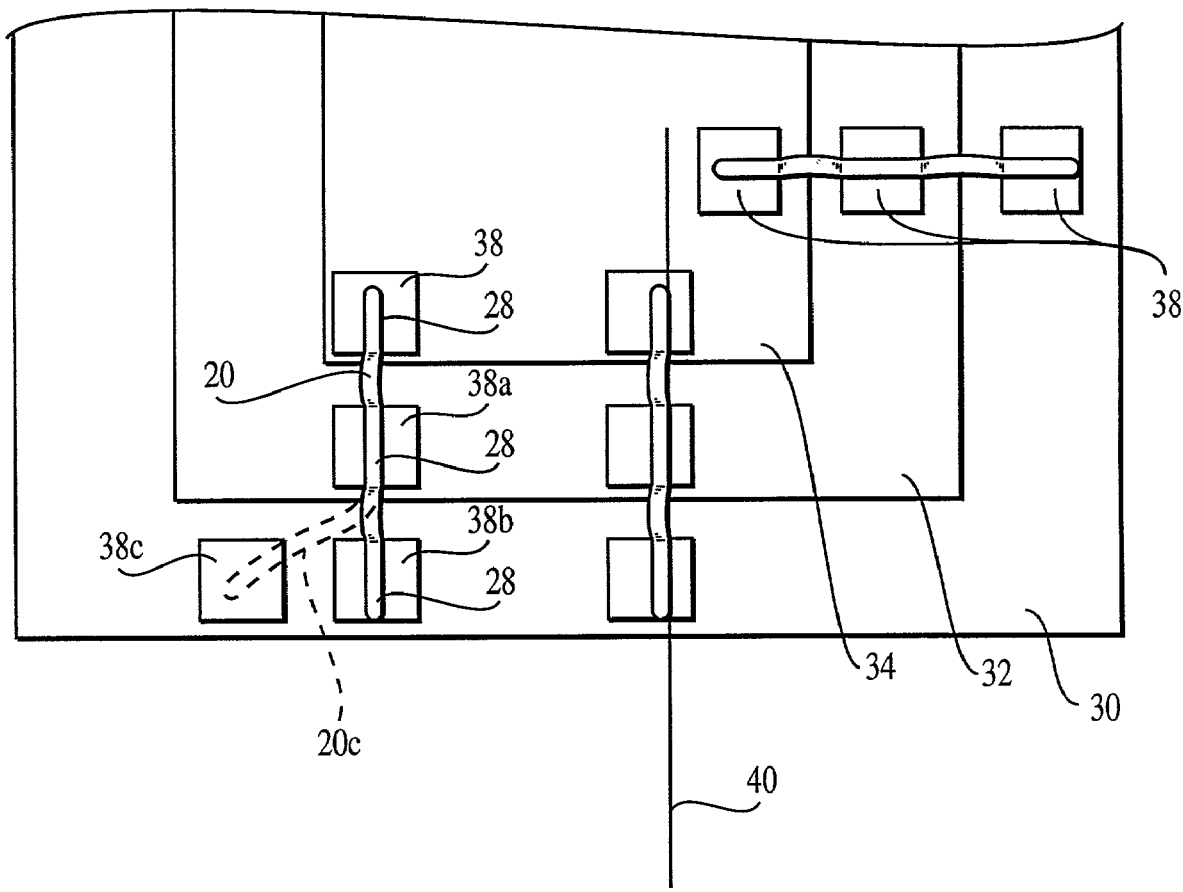

FIGS. 4A and 4B show an integrated circuit assembly comprising components 30, 32, and 34. These components can be, for example, a substrate 30, a bottom chip 32, and an upper chip 34. A connection between conductive areas, or bonding pads 38, of components 30, 32, and 34 can be made utilizing the wedge or stitch bonding technique discussed above. This bonding technique requires formation of linear wire bond sections 28 having lengths 29 (as shown in FIG. 3B) on each bonding pad 38 of the integrated circuit components 30, 32, 34. Because each stitch wire bond requires formation of a linear wire bond section 28, extending the wire 20 from one bonding pad to another bonding pad has to be done through substantially a linear motion of the capillary 10 because any significant angling of the capillary 10 would likely result in breakage of the wire 20.

For example, with reference to FIG. 4B, a stitch wire bond formed on bonding pad 38a would dictate the next stitch wire bond to be formed on bonding pad 38b. If, in use, it is desirable to extend the wire 20 from bonding pad 38a to form the next stitch wire bond on bonding pad 38c, the wire 20 (represented by dashed lines 20c) is susceptible to breaking. Additionally, having made the stitch wire bond having the linear section 28 on bonding pad 38a, a typical wire bonding apparatus cannot reliably make the required turn to reach bonding pad 38c. Consequently, the shape of the entire wire bond is limited to being substantially linear as represented by imaginary line 40 in FIG. 4B.

Thus, due to the need for linear bond sections 28 of stitch wire bonds, and the miniature, often microscopic nature of semiconductor and integrated circuit components and associated closely spaced bonding pads, it is very difficult to form a wire bond between the components 30, 32, 34 particularly if target bonding pads are angled away from each other.

The inventive method described herein allows for greater flexibility in forming wire bonding connections between multiple tiered surfaces and permits greater wire bonding angles between bond pads at different tiers of a multi-tiered assembly.

Figure 5A:
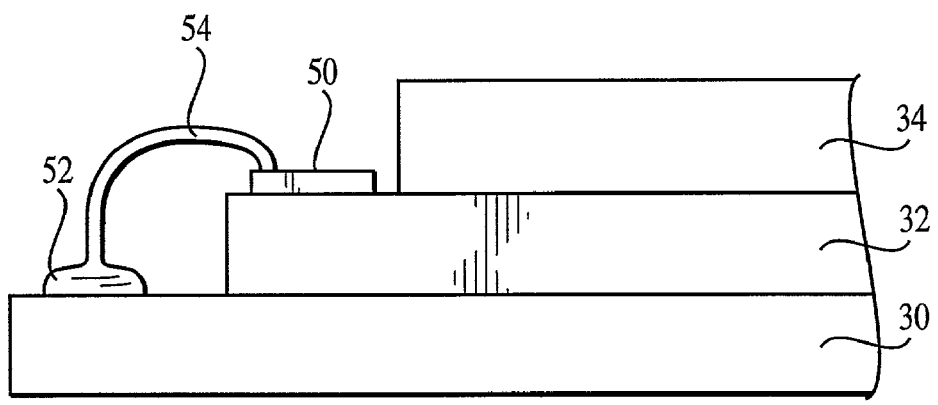
FIGS. 5A–5B show a wire bonding method of forming a wire bond among multiple chips in accordance with an embodiment of the present invention.

The invention will now be described with reference to FIGS. 5A, 5B through FIG. 8. Referring now to FIG. 5A, a wire bonding machine having an apparatus such as capillary 10 is used in an exemplary embodiment of the invention to first deposit a conductive bump 50 onto a bonding pad of the lower chip 32. The capillary is removed from contact with the bonding pad of the lower chip without drawing a wire 20 from bump 50. The capillary then bonds a ball 52 to the substrate 30, and, without cutting the wire 54, extends the wire 54 from the ball 52 to the bump 50. The bump 50, which is in place before wire 54 is bonded to lower chip 32, acts as a cushion to prevent damage to the chip 32 when wire 54 is bonded thereto. Then, with reference to FIG. 5B, the machine causes the capillary 10 to bond a bump 56 onto the upper chip 34. Thereafter, the machine causes the capillary 10 to bond a ball 58 on top of the bump 50 of the lower chip 32, and, without cutting the wire 60, extend wire 60 from the ball 58 to the bump 56.

Figure 5B:
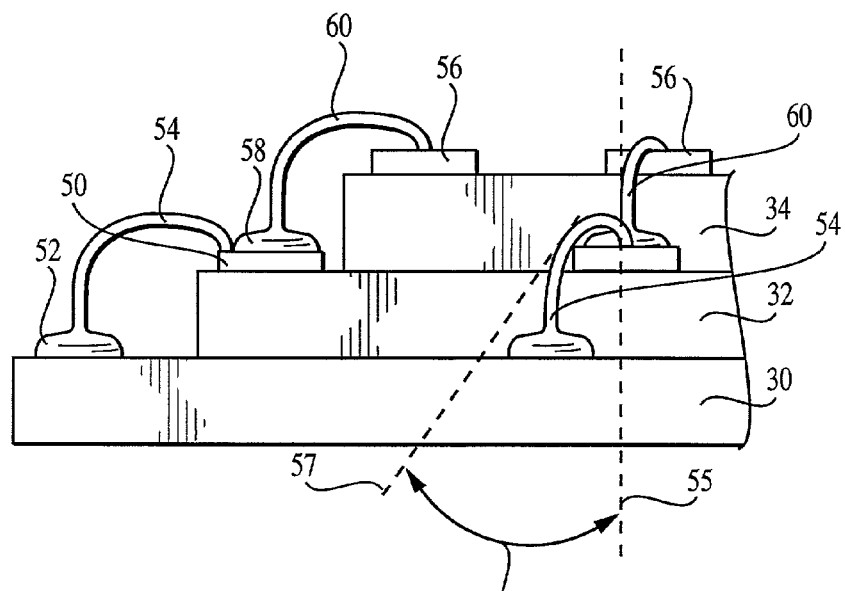
Figure 6:
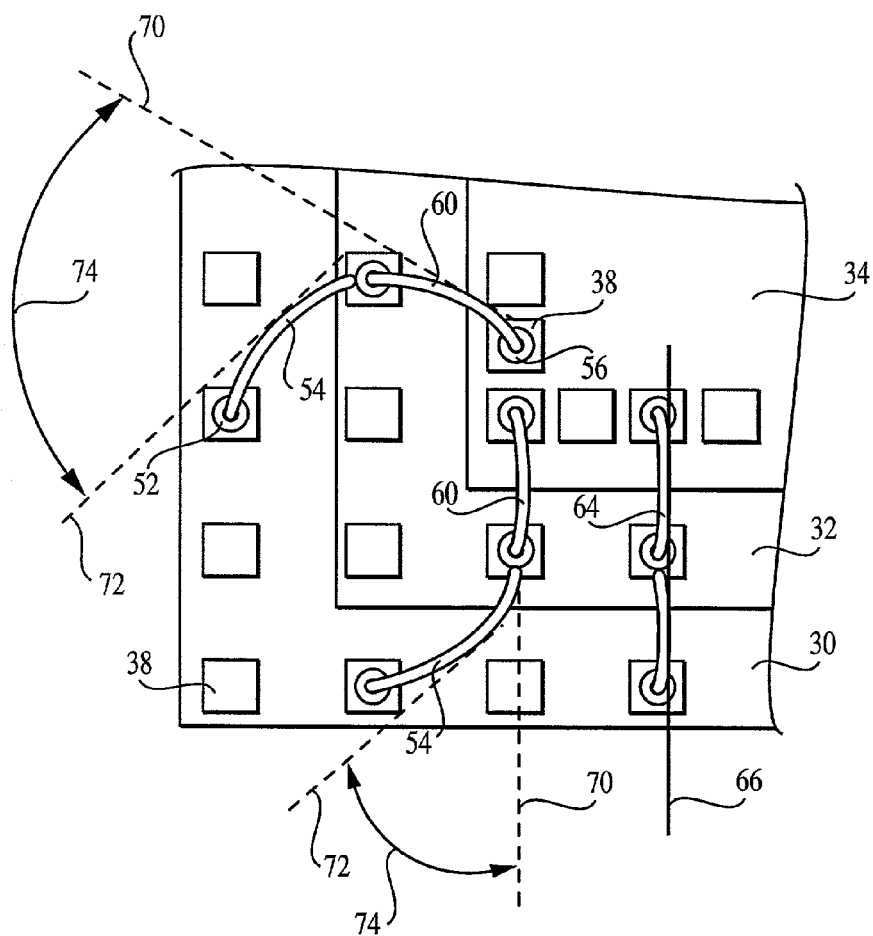
FIG. 6 is a top view of the wire bonding structure of FIG. 5B.

A side view and top view of one possible resultant structure constructed according to the method just described can be seen in FIGS. 5B and 6. FIG. 6 shows stacked integrated circuit components 30, 32, 34 having several wire bonds installed. The upper portion of the wire bond, wire 60, connects the lower chip 32 to the upper chip 34, while the lower potion of the wire bond, wire 54, connects the substrate 30 to the lower chip 32.

As can be appreciated from FIGS. 5B and 6, the lower portion of the bond wire 54 can be easily offset linearly from the upper portion of the bond wire 60 resulting in a stand off bonding connection between stacked chips and/or substrates. In FIG. 5B, imaginary line 55 is drawn along the longitudinal axis of the upper bond wire 60 and imaginary line 57 is drawn along the longitudinal axis of lower bond wire 54. Alternatively, imaginary lines 55 and 57 can be drawn between endpoints of bond wires 60 and 54. Arc 59, drawn between lines 55 and 57 represents an angle by which the upper and lower bond wires 60, 54 can be offset in the vertical plane.

Referring now to FIG. 6, imaginary lines 70 are drawn along the longitudinal axis of the upper bond wire 60, and imaginary lines 72 are drawn along the longitudinal axis of the lower bond wire 54. Arcs 74, drawn between lines 70 and 72, represent the angles by which the two portions of the wire bond can be offset in the horizontal plane to allow for improved capability in connecting semiconductor and integrated circuit components. A relatively linear wire bond 64, having an imaginary line 66 drawn along its longitudinal axis, can also be produced by the herein described method, and is shown for the purpose of comparison.

Figure 7:
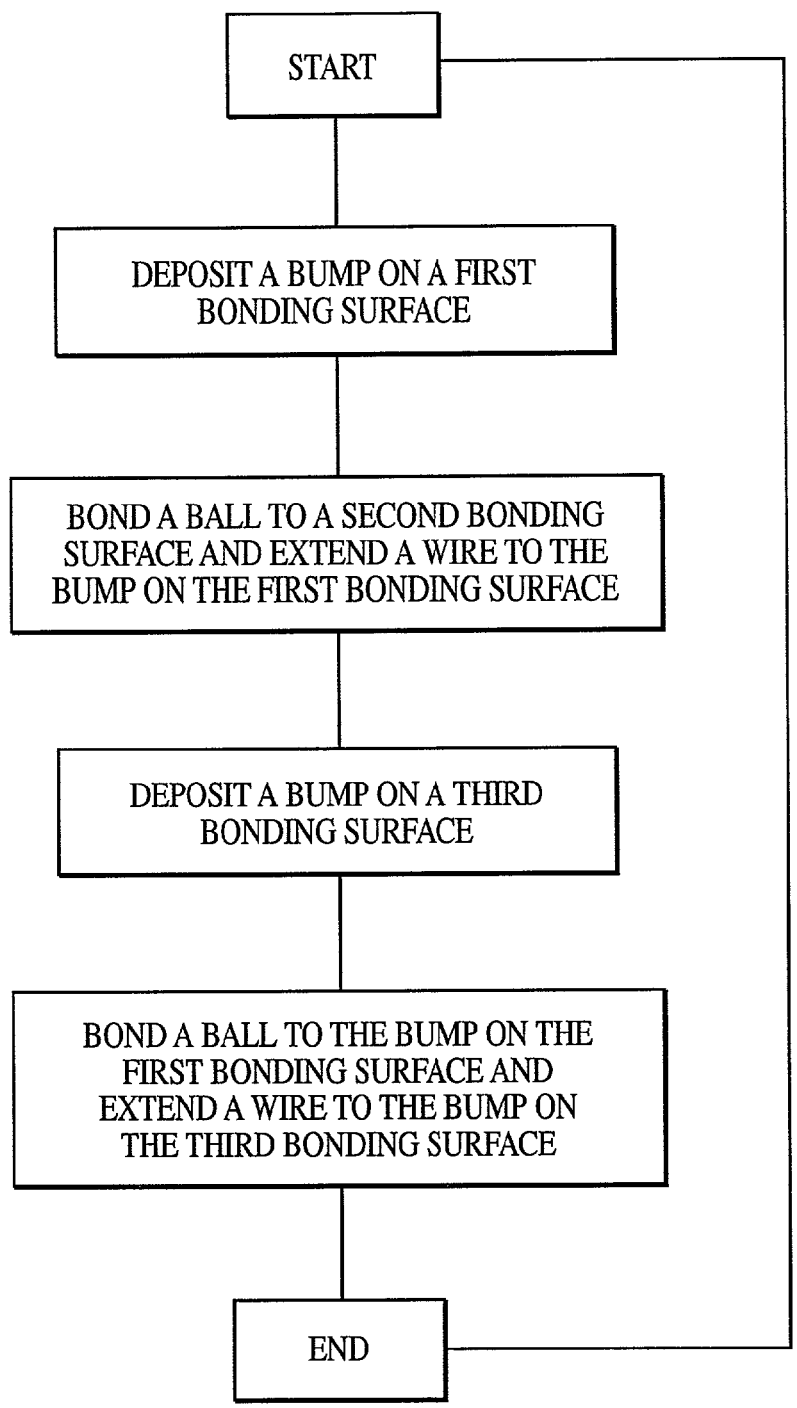
FIG. 7 is a diagram of the process steps of the present invention.

The foregoing wire bonding procedure can be performed by incorporating into a high-level software program the sequence of process steps of the present invention. Such a sequence of steps is illustrated in FIG. 7, and a software program containing the steps of FIG. 7 can be loaded into and executed by the controller 9 of the wire bonding apparatus of FIG. 1.

Figure 8:
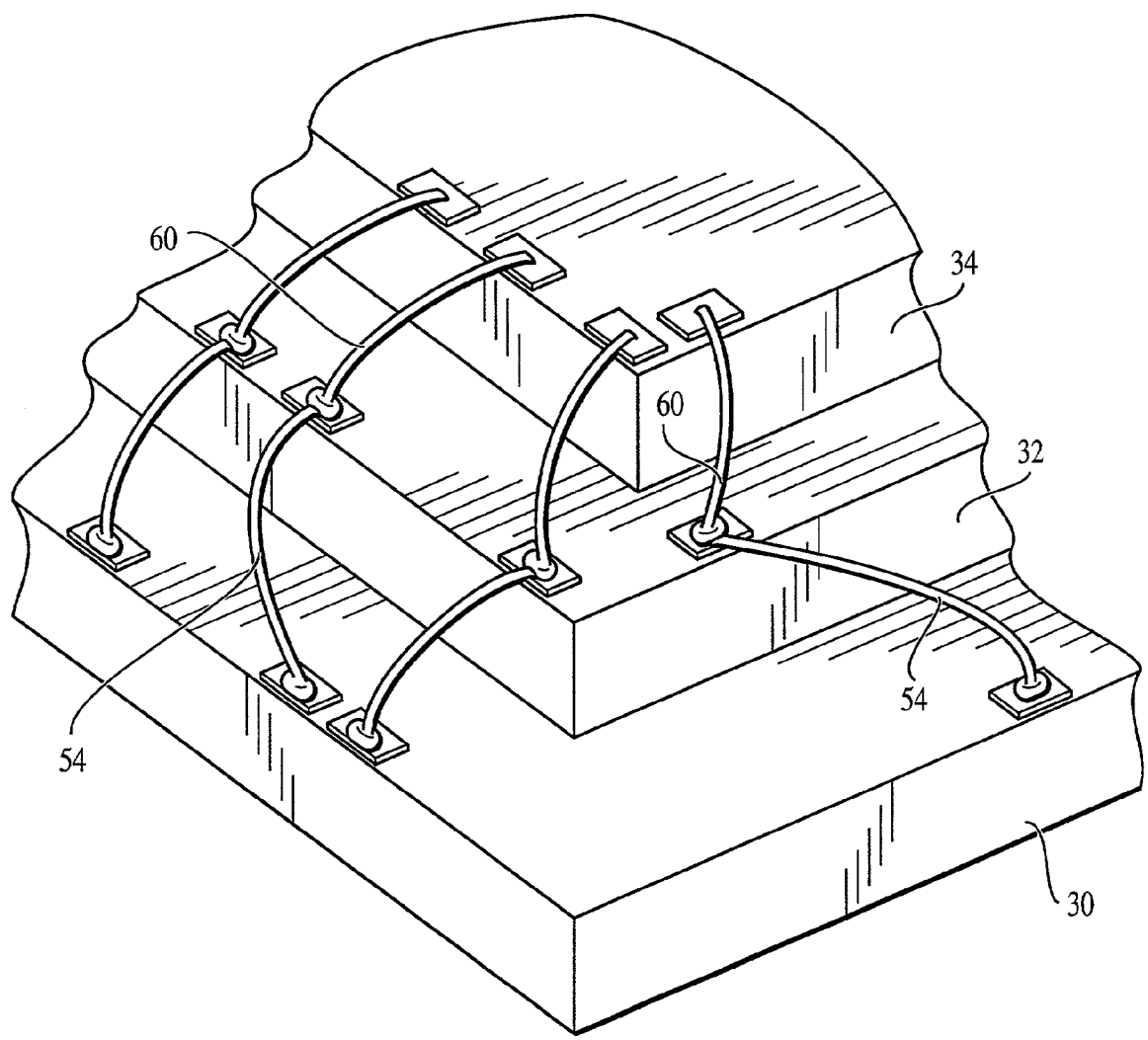
FIG. 8 is a perspective view of FIG. 6.

FIG. 8 shows a perspective view of the substrate 30, lower chip 32, and upper chip 34 having multiple wire bonds installed using the apparatus and method of the present invention. It can appreciated from FIG. 8 that the technique of the present invention allows for wire bonds between stacked layers of a device to be formed in various planes and at various angles to make possible connections between bond pads in various areas of the completed assembly.

While exemplary embodiments of the invention have been described and illustrated, it should be apparent that many modifications can be made to the present invention without departing from its spirit and scope. For example, while connections between stacked components have been described, the present invention is equally applicable for interconnecting components arranged side-by-side, in the same plane, or in other configurations. Accordingly the invention is not limited by the foregoing description or drawings, but is only limited by the scope of the appended claims.

What is claimed is:

1. A wire bonded structure comprising:
    a first bonding area, a second bonding area and a third bonding area respectively provided on first, second, and third components;
    a first wire bond between said first and said second bonding areas;
    a second wire bond between said second and said third bonding areas, wherein a bump is at one end of each of said first and second wire bonds; and
    at least one of said first and second wire bonds at said second bonding area being on top of the other of said first and second wire bond at said second bonding area, and wherein one of said bumps is formed on said second bonding area in electrical communication with said first and second wire bonds.

2. A structure as in claim 1 wherein at least one of said components is an integrated circuit chip.

3. A structure as in claim 1 wherein said first component is a substrate and said second and third components are integrated circuit chips.

4. A structure as in claim 1 wherein said first, second and third components are stacked.

5. A wire bonded structure comprising:
    a first bonding area, a second bonding area and a third bonding area respectively provided on first, second, and third components, wherein at least two of said first, second and third components are in the same plane;
    a first wire bond between said first and said second bonding areas;
    a second wire bond between said second and said third bonding areas, wherein a bump is at one end of each of said first and second wire bonds; and
    at least one of said first and second wire bonds at said second bonding area being on top of the other of said first and second wire bond at said second bonding area, and wherein one of said bumps is formed on said second bonding area in electrical communication with said first and second wire bonds.

6. A wire bonded structure comprising:
    a first bonding area, a second bonding area and a third bonding area respectively provided on first, second, and third components wherein each of said first, second and third components are in the same plane;
    a first wire bond between said first and said second bonding areas;
    a second wire bond between said second and said third bonding areas, wherein a bump is at one end of each of said first and second wire bonds; and
    at least one of first and second wire bonds at said second bonding area being on top of the other of said first and second wire bond at said second bonding area.

7. A wire bonded structure comprising:
    a first bonding area, a second bonding area and a third bonding area respectively provided on first, second, and third components, wherein said first component is a substrate and said second and third components are integrated circuit chips, and wherein said integrated circuit chips are stacked over said substrate;
    a first wire bond between said first and said second bonding areas;
    a second wire bond between said second and said third bonding areas, wherein a bump is at one end of each of said first and second wire bonds; and
    at least one of said first and second wire bonds at said second bonding area being on top of the other of said first and second wire bond at said second bonding area, and wherein one of said bumps is formed on said second bonding area in electrical communication with said first and second wire bonds.

8. A wire bonded structure comprising:
    a first bonding area, a second bonding area and a third bonding area respectively provided on first, second, and third components;
    a first wire bond between said first and said second bonding areas;
    a second wire bond between said second and said third bonding areas, wherein a bump is at one end of each of said first and second wire bonds, and a ball bond is at the other end of each of said first and second wire bonds; and
    at least one of said first and second wire bonds at said second bonding area being on top of the other of said first and second wire bond at said second bonding area, and wherein one of said bumps is formed on said second bonding area in electrical communication with said first and second wire bonds.

9. A structure as in claim 1 wherein an imaginary line drawn along a longitudinal axis of said first wire bond and an imaginary line drawn along a longitudinal axis of said second wire bond are not parallel.

10. A structure as in claim 9 wherein an intersection between said imaginary lines forms an angle in a horizontal plane.

11. A structure as in claim 9 wherein an intersection between said imaginary lines forms an angle in a vertical plane.

12. A structure as in claim 9 wherein an intersection between said imaginary lines forms an angle in vertical and horizontal planes.

13. A wire bonded structure comprising:
    a substrate, a lower chip positioned over said substrate, and an upper chip positioned over said lower chip, each of said substrate, lower chip and upper chip having exposed bonding pads;
    a first wire bond formed from a bonding pad of said substrate to a bonding pad of said lower chip;
    a second wire bond formed from said bonding pad of said lower chip to a bonding pad of said upper chip and electrically connected to said first wire bond; and
    wherein said first wire bond and said second wire bond are configured such that an imaginary line drawn between endpoints of said first wire bond and an imaginary line drawn between endpoints of said second wire bond are not parallel.

14. A structure as in claim 13 wherein an intersection between said imaginary lines forms an angle in a horizontal plane.

15. A structure as in claim 13 wherein an intersection between said imaginary lines forms an angle in a vertical plane.

16. A structure as in claim 13 wherein an intersection between said imaginary lines forms an angle in horizontal and vertical planes.

17. A wire bonded structure comprising:
a first conductive bump on a first bonding surface;
a first ball bond on a second bonding surface;
a first wire bond extending from said first ball bond to said first conductive bump;
a second conductive bump on a third bonding surface;
a second ball bond on said first bonding surface in electrical communication with said first conductive bump; and
a second wire bond between said second ball bond and said second conductive bump.

18. The structure of claim 17 wherein said second ball bond is on top of said first conductive bump.

19. The structure of claim 17 wherein said first and second wire bonds are gold wire bonds.

20. The structure of claim 17 wherein said second wire bond is at an angle with respect to said first wire bond in a vertical plane.

21. The structure of claim 17 wherein said second wire bond is at an angle with respect to said first wire bond in a horizontal plane.

22. The structure of claim 17 wherein said second wire bond is at an angle with respect to said first wire bond in vertical and horizontal planes.

23. A method of wire bonding, said method comprising:
forming a first wire bond between first and second components;
forming a second wire bond between said second component and a third component such that said second wire bond is in electrical communication with said first wire bond; and
connecting said first wire bond on at least one end using a ball bond on top of a first conductive bump.

24. The method of claim 23 further comprising connecting the second wire bond on at least one end using a ball bond.

25. The method according to claim 23 further comprising bonding said first bump to said second component prior to forming said first wire bond.

26. The method according to claim 25 further comprising forming said first wire bond by forming a first ball on said first component and extending a wire bond from said first ball to said first bump.

27. The method according to claim 26 further comprising forming a second bump on said third component prior to forming said second wire bond.

28. The method according to claim 27 further comprising forming a second ball in electrical contact with said first bump.

29. The method according to claim 28 further comprising forming said second wire bond by extending a wire from said second ball to said second bump.

30. The method according to claim 23 wherein said second wire bond is formed at an angle with respect to said first wire bond in a horizontal plane.

31. The method according to claim 23 wherein said second wire bond is formed at an angle with respect to said first wire bond in a vertical plane.

32. The method according to claim 23 wherein said second wire bond is formed at an angle with respect to said first wire bond in horizontal and vertical planes.

33. A method of wire bonding comprising:
forming a first conductive bump on a first surface;
forming a first ball bond on a second surface;
forming a first wire bond from said first ball bond to said first conductive bump;
forming a second conductive bump on a third surface;
forming a second ball bond on said first surface in electrical communication with said first conductive bump; and
forming a second wire bond from said second ball bond to said second conductive bump.

34. The method of claim 33 wherein said second ball bond is formed on top of said first conductive bump.

35. The method of claim 33 wherein said second wire bond is formed at an angle with respect to said first wire bond in a vertical plane.

36. The method of claim 33 wherein said second wire bond is formed at an angle with respect to said first wire bond in a horizontal plane.

37. The method of claim 33 wherein said second wire bond is formed at an angle with respect to said first wire bond in horizontal and vertical planes.

38. The method of claim 33 wherein the method steps are performed with a wire bonding apparatus.

39. The method of claim 38 wherein said wire bonding apparatus executes a software program to perform the method steps.

40. The method of claim 39 wherein said software program is executed in a controller of said wire bonding apparatus.

* * * * *